United States Patent
Biber et al.

(10) Patent No.: US 8,487,622 B2
(45) Date of Patent: Jul. 16, 2013

(54) MR SIGNAL TRANSMISSION IN A LOCAL COIL ARRANGEMENT

(75) Inventors: Stephan Biber, Erlangen (DE); Jan Bollenbeck, Eggolsheim (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 464 days.

(21) Appl. No.: 12/893,286

(22) Filed: Sep. 29, 2010

(65) Prior Publication Data

US 2011/0109315 A1 May 12, 2011

(30) Foreign Application Priority Data

Nov. 6, 2009 (DE) .......................... 10 2009 052 197

(51) Int. Cl.
*G01V 3/00* (2006.01)
(52) U.S. Cl.
USPC ...................................................... 324/318
(58) Field of Classification Search
USPC .................... 324/300–322; 600/407–445
See application file for complete search history.

(56) References Cited

U.S. PATENT DOCUMENTS

| | | | | |
|---|---|---|---|---|
| 4,992,736 A | * | 2/1991 | Stormont et al. | 324/309 |
| 7,378,844 B2 | * | 5/2008 | Watkins et al. | 324/304 |
| 7,443,165 B2 | | 10/2008 | Varjo | |
| 7,592,813 B2 | | 9/2009 | Boskamp et al. | |
| 7,750,635 B2 | | 7/2010 | Van Helvoort et al. | |
| 7,852,080 B2 | * | 12/2010 | Takamori et al. | 324/318 |
| 7,940,046 B2 | * | 5/2011 | Baumgartl et al. | 324/322 |
| 2008/0164879 A1 | | 7/2008 | Bollenbeck | |
| 2009/0286478 A1 | | 11/2009 | Biber et al. | |
| 2011/0109315 A1 | * | 5/2011 | Biber et al. | 324/318 |
| 2011/0254732 A1 | * | 10/2011 | Martin et al. | 342/357.59 |

* cited by examiner

*Primary Examiner* — Brij Shrivastav
(74) *Attorney, Agent, or Firm* — Schiff Hardin LLP

(57) ABSTRACT

In a magnetic resonance tomography local coil arrangement and a method for processing signals received thereby, at least one local coil is fashioned to receive at least one reception signal and at least one amplifier is provided that amplifies the at least one reception signal. A frequency converter generates at least one intermediate frequency signal from the at least one reception signal the intermediate frequency of the intermediate frequency signal differing from the reception signal frequency of each reception signal. An analog-digital converter converts the analog intermediate frequency signal into a digitized signal. A shielding device shields against at least radio-frequency signals, the shielding device surrounding at least the analog-digital converter. At least one frequency filter is arranged between the at least one local coil and the analog-digital converter, the frequency filter exhibiting a transmission range for signals with the intermediate frequency of an intermediate frequency signal. The digitized signal is transmitted from the local coil arrangement.

32 Claims, 8 Drawing Sheets

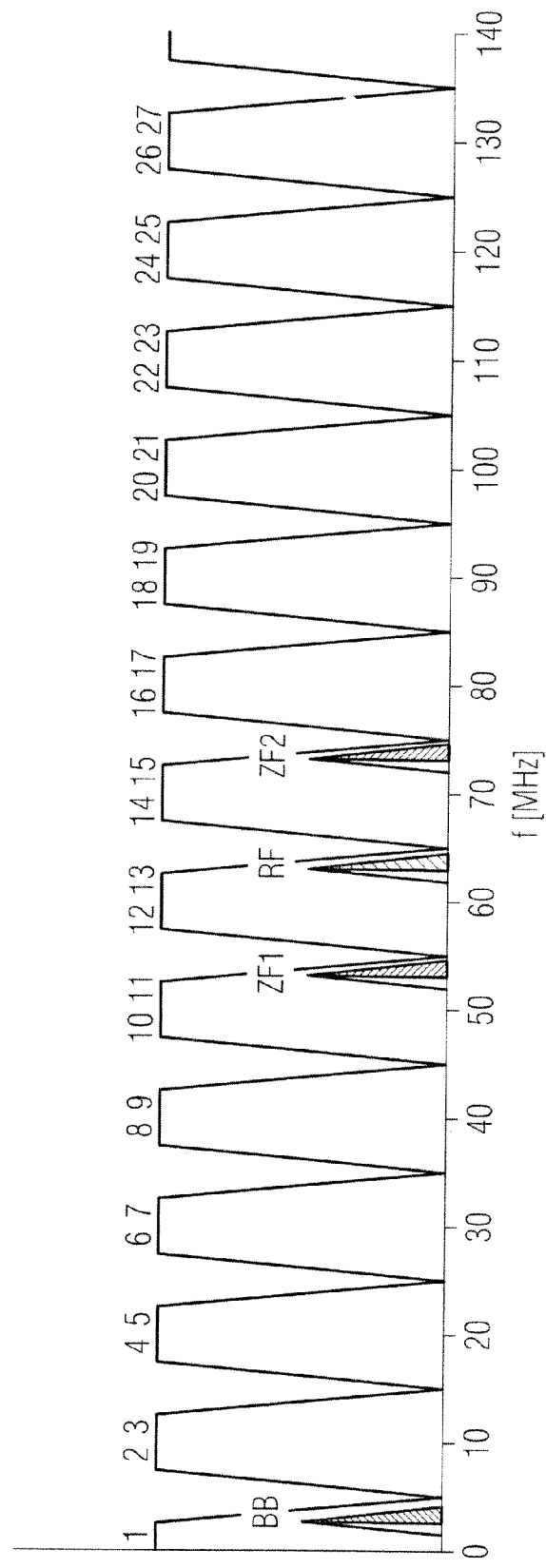

III

IV

MR SIGNAL TRANSMISSION IN A LOCAL COIL ARRANGEMENT

BACKGROUND OF THE INVENTION

1. Field of the Invention

The invention concerns magnetic resonance tomography (MRT) local coil arrangements and methods to transmit a reception signal received by such a local coil arrangement.

2. Description of the Prior Art

Arrangements to transmit magnetic resonance signals that are received with the use of local coils are described in U.S. Pat. Nos. DE102008023467 and 7,592,813, for example.

SUMMARY OF THE INVENTION

An object of the present invention is to facilitate efficient transmission of signals received by at least one local coil to an evaluation device.

The invention enables an efficient transmission of local coil signals via radio technology to an evaluation device.

BRIEF DESCRIPTION OF THE DRAWINGS

FIG. 3 is a schematic illustration of components of a local coil arrangement according to the invention and a receiver unit for the signals broadcast by the local coil arrangement.

DESCRIPTION OF THE PREFERRED EMBODIMENTS

Figure 1:
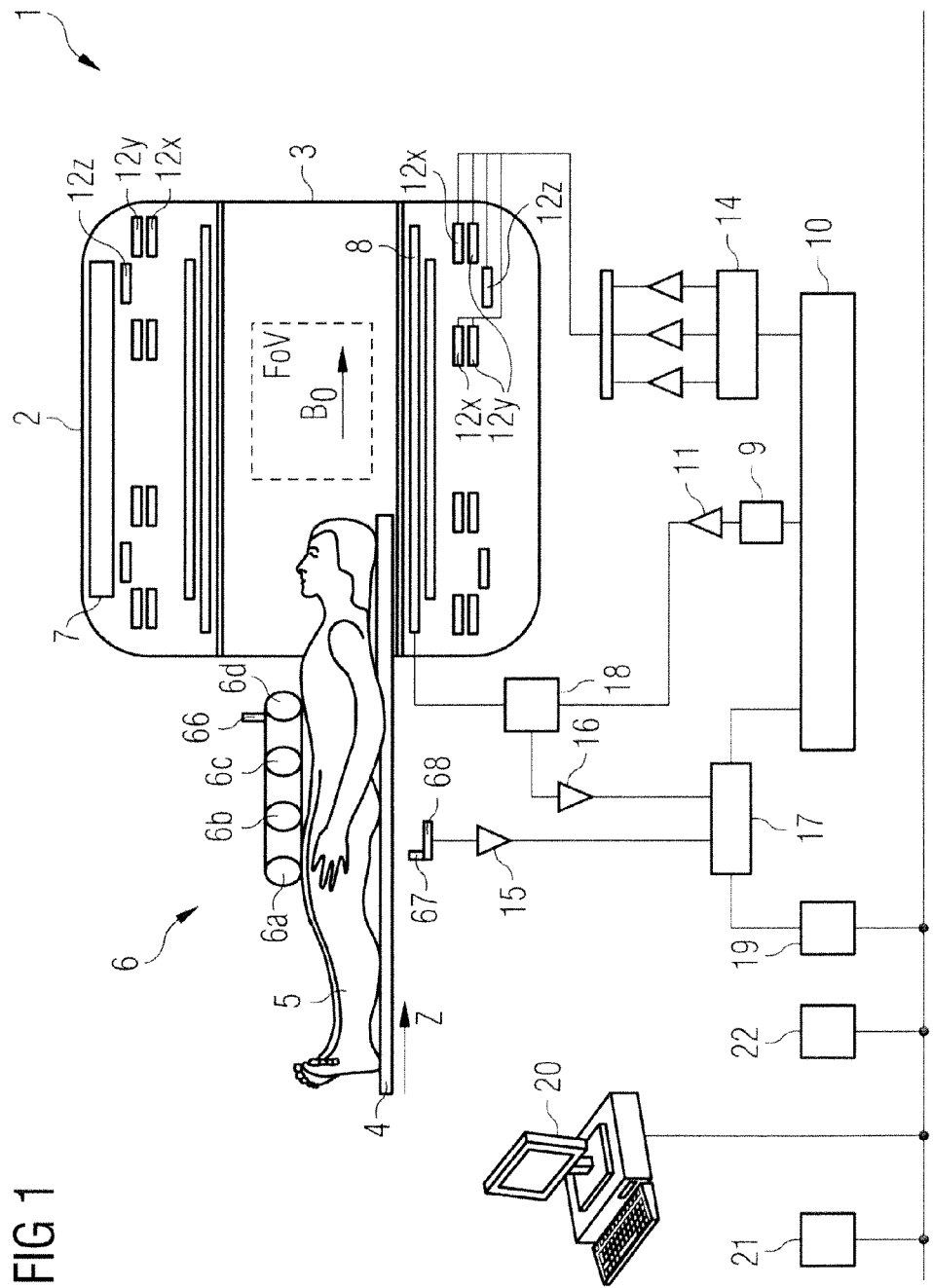
FIG. 1 schematically shows an MRT whole-body coil and a local coil arrangement.

FIG. 1 shows a magnetic resonance apparatus MRT 1 with a whole-body coil 2 with a (here tube-shaped) space 3 into which a patient bed 4 (for example with a patient 5 and a local coil arrangement 6) can be driven in the direction of the arrow z in order to generate exposures of the patient 5. A local coil arrangement 6 (with an antenna 66 and multiple local coils 6a, 6b, 6c, 6d) with which good exposures are enabled in a local region (also called a field of view) is placed on the patient. Signals of the local coil arrangement can be evaluated (for example transformed into images and stored or displayed) by a known, conventional evaluation device (67, 66, 15, 17 etc.) of the MRT 1 that can be connected to the local coil arrangement 6 via coaxial cable, or here via radio.

In order to examine a body by means of magnetic resonance imaging with the magnetic resonance apparatus MRT 1, different magnetic fields matched as precisely to one another as possible in terms of their temporal and spatial characteristics are radiated at the body.

A strong magnet—often a cryomagnet 7 with a measurement chamber that defines the (here tunnel-shaped) space 3—generates a static, strong basic magnetic field $B_0$ that, for example, amounts to 0.2 Tesla to 3 Tesla or more. The patient 5 to be examined that is borne on the patient bed 4 and is driven (moved) into an approximately homogeneous region of the basic magnetic field 7 in the examination region ("field of view") thereof.

Excitation of nuclear spins of atomic nuclei in the portion of the patient located in the examination region 5 ensues by means of magnetic radio-frequency excitation pulses that are radiated by a radio-frequency antenna (shown here as a body coil 8). Radio-frequency excitation pulses are generated by a pulse generation unit 9 that is controlled by a pulse sequence control unit 10. After amplification in a radio-frequency amplifier 11, they are conducted to the radio-frequency antenna 8. The radio-frequency system shown here is only schematically indicated. Often more than one pulse generation unit 9, more than one radio-frequency amplifier 11 and multiple radio-frequency antennas 8 are used in the magnetic resonance apparatus 1.

Furthermore, the magnetic resonance apparatus 1 has gradient coils $12x$, $12y$, $12z$ with which magnetic gradient fields for selective slice excitation and for spatial coding of the measurement signal are radiated in a measurement. The gradient coils $12x$, $12y$, $12z$ are controlled by a gradient coil control unit 14 that—like the pulse generation unit 9—is connected with the pulse sequence control unit 10.

The signals emitted by the excited nuclear spins are received by the body coil 8 and/or by local coils 6a, 6b, 6c, 6d, amplified by associated radio-frequency preamplifiers 15, 16 and additionally processed and digitized by a receiver unit 17. The acquired measurement data are digitized and stored as complex numerical values in a k-space matrix in a memory. By means of a multidimensional Fourier transformation, an associated MR image can be reconstructed from the k-space matrix populated with these values.

In the case of a coil that can be operated both in transmission mode and reception mode—for example the body coil 8—the appropriate signal relaying is regulated by an upstream transmission/reception diplexer 18.

An image processing unit 19 generates from the measurement data an image that is shown to a user via an operator console 20 and/or is stored in a memory unit 21. A central computer 22 controls the individual system components.

Here reception signals received with the local coils 6a, 6b, 6c, 6d of the local coil arrangement 6 are preamplified in the local coil arrangement 6, digitized, prepared in a transmission device and sent by the local coil arrangement 6 with an antenna 66, and received and amplified by a receiver device 68 with an antenna 67 in order to be processed further in the receiver unit 17 (=here "DSP" unit to the right in FIG. 5).

In MR tomography today, images with high signal-to-noise ratio (SNR) are normally acquired with local coils (coils). As shown above, these are antenna systems that are attached in direct proximity on (anterior) or below (posterior) the patient. In an MR measurement, the excited nuclei induce a voltage in the individual antennas of the local coil, which voltage is then amplified with a low-noise preamplifier (LNA, preamp for example) and is typically relayed via wires (cables) to the receiver electronics. Systems known as high-field systems (1.5 T and more) are used to improve the signal-to-noise ratio, even in high-resolution images. Since more individual antennas are connected to the MR receiver system than there are receivers present, a switching matrix (called an RCCS) is installed between the receiver antennas and the receiver. This routes the currently active receiver channels (most often those that are presently situated in the field of view of the magnet) to the appropriate receiver. It is thereby possible to connect more coil elements than there are receivers present since, given a whole-body coverage, only the coils that are located in the FoV (Field of View), or in the homogeneity volume of the magnet, must be read out (temporarily connected to a receiver).

Here an antenna system that can be one antenna element or an array coil composed of multiple antenna elements (coil elements) 6a, 6b, 6c, 6d is generally designated as a "local coil arrangement" 6. These individual antenna elements are most often executed as loop antennas (loops), butterfly or saddle coils. A local coil arrangement includes of the coil elements, the preamplifiers, additional electronics (surface wave barriers etc.) and wiring, the housing and most often a cable with plug via which it is connected to the MRT system. A receiver (RX) mounted at the system filters and digitizes the signal received by a local coil—here via radio (arrow between the local coil housing an the DSP unit in FIG. 2)—and transfers the data to the digital signal processing ("DSP") unit that most often derives one image or a spectrum from the data acquired in a measurement, and provides it to the user, for example for a subsequent diagnosis or for storage. In known MR systems, the signals are preamplified in a low-noise manner in the local coil arrangement and are then most often directed to the receiver via an interposed switching matrix for channel selection. There the digitization occurs, which ensues either by direct sampling of the original frequency or by preceding mixing in an intermediate frequency range and subsequent sampling. With regard to the integration of components, there is a trend that increasingly many RF components come closer to the magnet or are integrated into the local coil arrangement.

Here an integration of the signal digitization into the local coil takes place. In addition to integration, the digitization offers various possibilities for wireless transfer of the MR signal from the local coil to the evaluating ("DSP") system. The digital data stream would be able to be transmitted wirelessly relatively well from the local coil arrangement to the system using corresponding protocols and correction mechanisms. Additional advantages of digitization in the local coil arrangement are described in WO 2006/048816 A1 and DE 102007001299 A1. However, digitization of the signals in the local coil arrangement is technically difficult to realize for the following reasons:

1. An analog-digital converter (ADW) generates broadband noise and interference signals of high level. If the ADW is located in immediate proximity to a local coil, the danger exists that the reception signals amplified by the extremely low-noise preamplifiers of the local coils are severely distorted by the radiation of the ADW in the MR frequency band. The image quality (signal-to-noise) would thereby drop in a completely unacceptable manner and artifacts could occur in the image.

2. The ADW would have to digitally convert (16-20 bit) the entire dynamic of the MR signal and, in spite of this, thereby operate with approximately 5-10 MHz per channel.

3. In order to be able to optimally utilize the dynamic of the ADW, the signal amplitude of the input signal must be amplified by >50 dB. If the amplification must be applied entirely in one and the same frequency position, it can lead to a self-excitation of the system and thus to wild oscillations. [sic] In particular since a resonant reception coil is connected to the start of the reception chain.

4. The ADW would have to operate with very little power loss in order on the one hand to not heat the local coil (and thereby create a risk to the patient) and in order on the other hand to keep the cost for the provision of power source within limits given wireless operation.

5. A conventional frequency conversion of the input signal via mixing or multiplication has the disadvantage that the signal inevitably experiences an attenuation in the conversion (i.e. conversion loss). The signal energy is divided into the different mixing products (essentially $ZF_{1,2}=|f_{LO}\pm f_{Sig}|$). Moreover, ohmic and crossover losses arise in the mixer. The losses must be compensated via additional cascade amplification. In order to optimize the signal-to-noise ratio at the end of the chain, it is advantageous to advance the amplification to the mixer (LNA). The mixer must be dimensioned accordingly resistant to high-level signals. The arrangement subsequently described under 3) avoids this disadvantage.

The levels of the digital signals in and at the output of the ADW are many orders of magnitude above the RF reception signal levels that are to be detected. Interference power that is radiated in the reception frequency range leads to artifacts in the MR imaging or, respectively, spectroscopy. It can additionally lead to aliasing of interference components whose frequency spectrum lies in an aliasing frequency range of the sampling.

The interference spectrum can include low-noise components exhibiting a noise-like structure ("digital noise"). Additionally, periodic interferences can occur. Periodic signals are emphasized relative to the noise baseline in a high resolution FFT. Due to the repeated FFT required for MMR imaging, this can lead to artifacts even if the signal power remains markedly below the noise output (which lies within the resolution bandwidth).

Here a shielding ("S" in FIG. 2) of the digital portion (digital circuit in which the AD converter ADW is located) of the local coil arrangement is provided for digitization within the coil. The shielding "S" is executed so that no interference signals or noise in the MR frequency band can exit from the shielding or enter through this. Given directly sampling systems (The MR is not mixed with an intermediate frequency before the digitization), this is extremely problematical since the MR signal would have to be directed into the shielding box via a conductor. This signal conductor would have to be dimensioned so that this transfers the MR frequency from outside the shielding box into the inside. At the same time, however, this conductor is then also in the position to transfer interference signals from inside the shielding box outward (in proximity to the antenna elements or preamplifiers). The through-conductor line of the MR signal into the shielding chamber (enclosure) (=shielding "S" in FIG. 2) would therefore be the largest EMC leak of the shielding chamber. This fact leads to the situation that the entire system (in the case of disadvantageous phase position of the signal back-coupled outside of the shielding box via the amplifier) can become unstable. In the case of advantageous phase position (no self-oscillation) and disadvantageous relationships of the coupling and the amplification, it leads at least to an (unacceptably high) elevation of the noise level of the reception arrangement. It must additionally be taken into account that array antennas can lead to couplings of the noise signal of an ADW with arbitrary antenna elements. For example, this means: in the event that the shielding chamber (with the weak point in the through-conductor) is situated geometrically above an antenna element that is associated with a different ADW, this likewise leads to an impermissible increase of the noise level given an injection of noise at the MR frequency.

Given direct sampling, the conduction of the MR signal through into a shielding chamber with ADW would inherently be a weak point of the concept. Therefore, it must be ensured that the interference power exiting this interface does not lead to self-excitation of the system (wild oscillations). It must be taken into account that a resonant antenna (local coil) is located in the reception chain input. A remedy would be the use of non-reciprocal components or conductors or a decoupling amplifier in ZF. However, since this is generally based on ferrite modules, it is not suitable in the magnetic field of the MR magnet. The electromagnetic leakage of the shielding chamber of the ADW and the realization of the signal through-conductor into the shielding chamber is serious not only for directly sampling systems but also for other digitization concepts.

Figure 2:
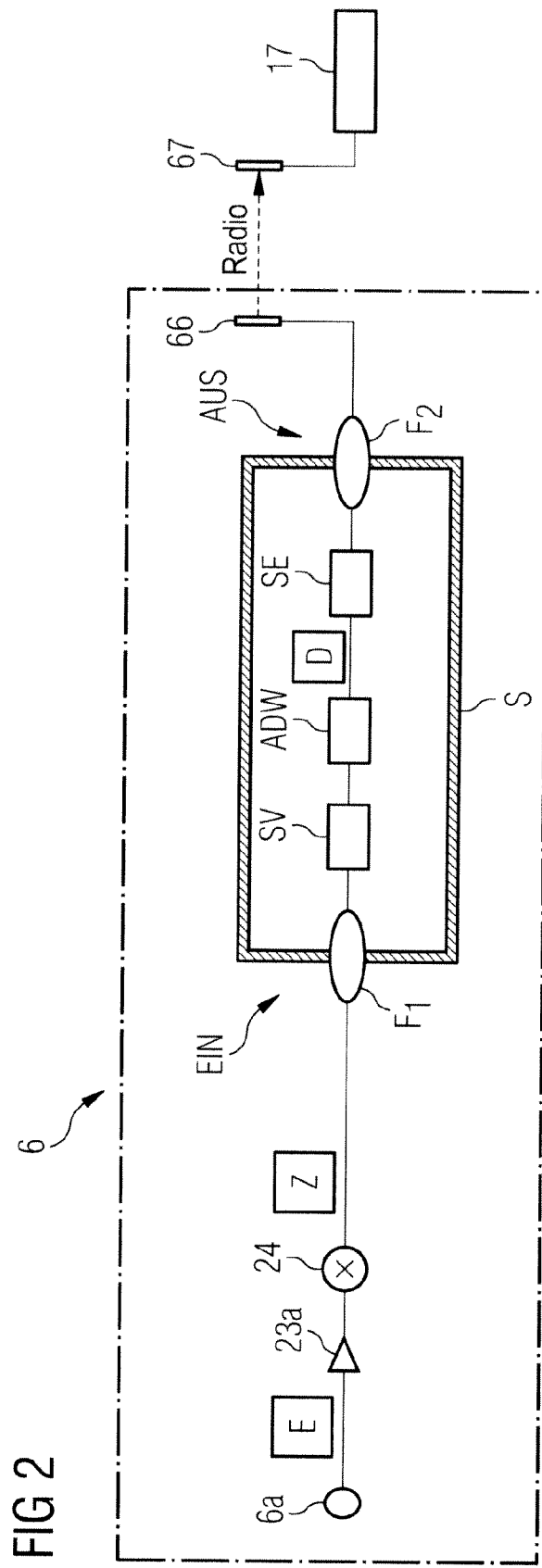
FIG. 2 is a schematic illustration of components of a local coil arrangement according to the invention.
Figure 4A:
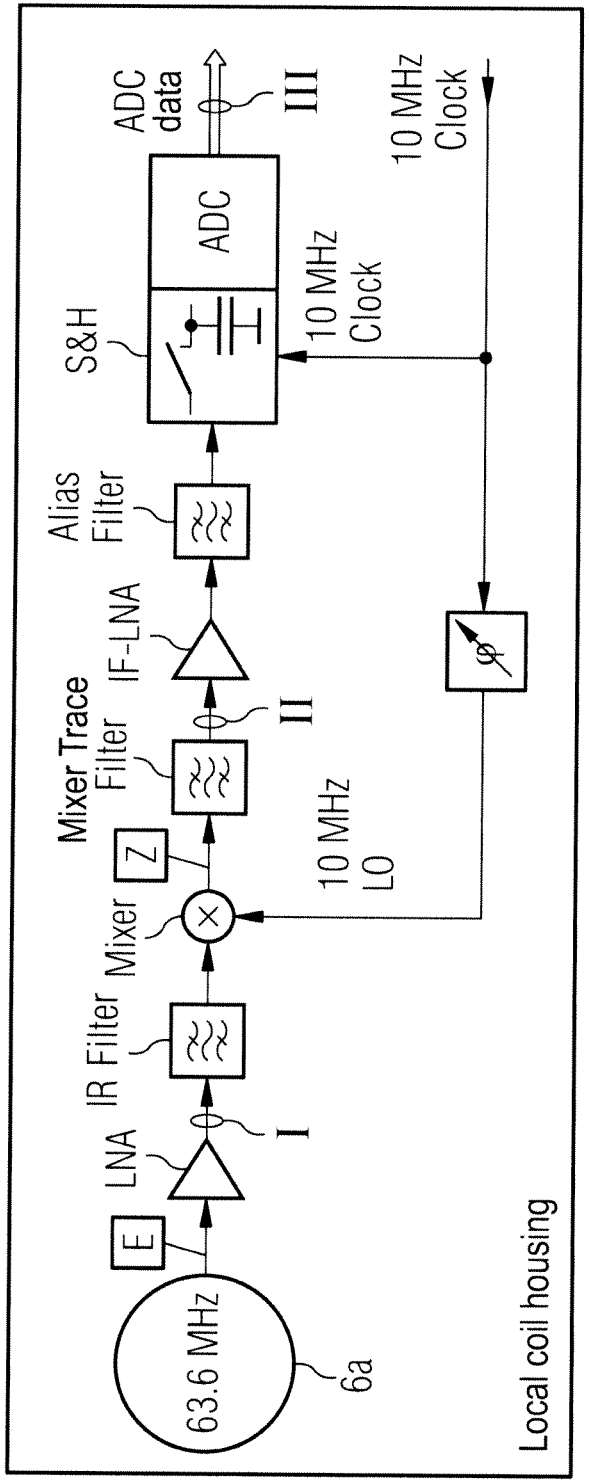
FIG. 4A is a schematic illustration of components of a local coil arrangement according to the invention.
Figure 4B:
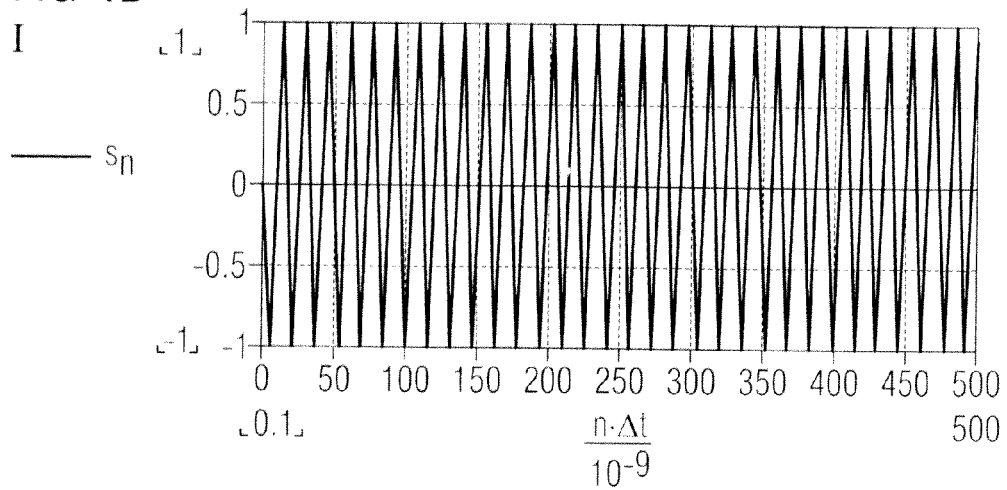
FIGS. 4B, 4C and 4D show signal curves in the time period at different points of the local coil arrangement.
Figure 4C:
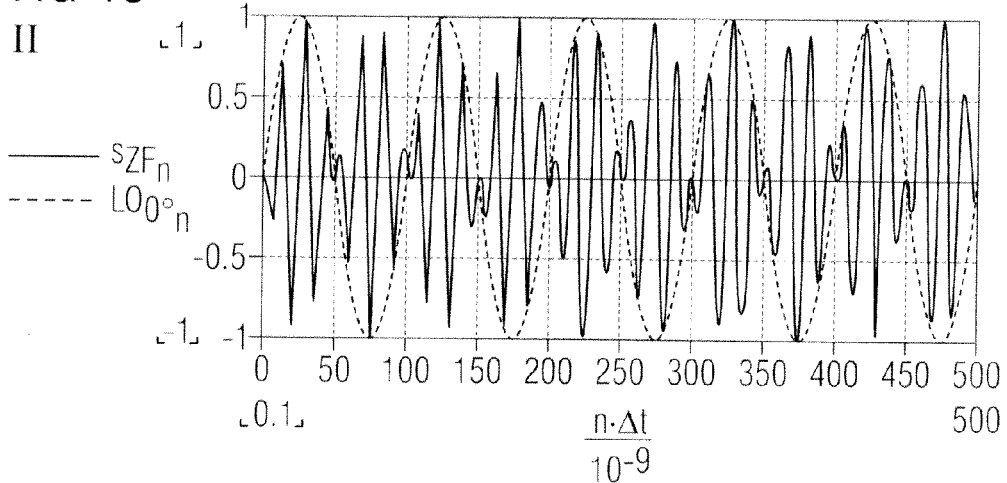
Figure 4D:
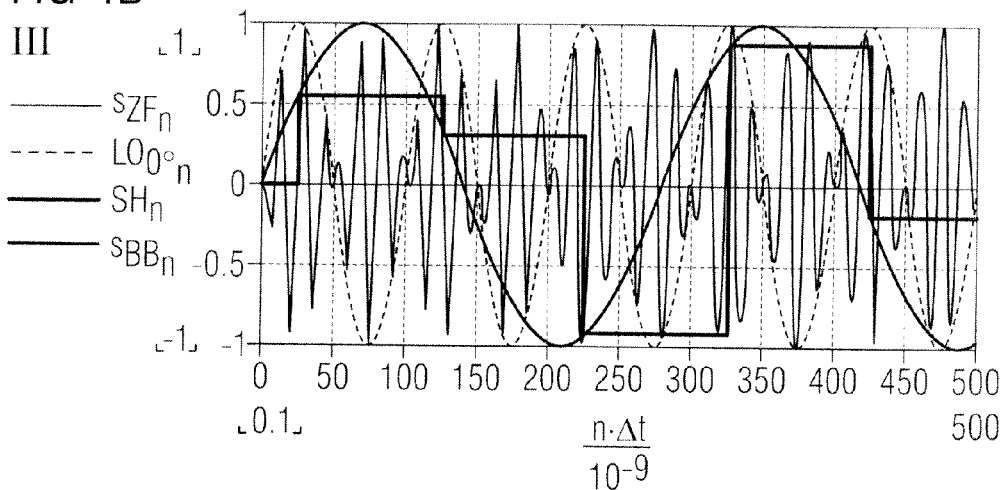

The following describes an exemplary embodiment according to the invention for decoupling of the ADW from the local coil (see FIG. 2).

1. After the preamplification of the MR signal via a low-noise amplifier, the MR signal is converted to an intermediate frequency (for example as described in "Dynamic Deconversion Module for MR Applications," Black, et al. ISMRM (2008), which is herewith part of the Application ("incorporated by reference")). The intermediate frequency (ZF) can be markedly below the MR frequency band; however, it can also be markedly above the MR frequency in the case of a "high ZF". To convert the MR signal into another frequency position, a subcarrier (local oscillator LO) is used that is either generated in the coil (using a reference signal from the system) or is transferred via wires or wirelessly to the coil.

2. The through-conduction of the signal into the shielding box takes place not at the MR frequency but rather can be executed with high-pass character ("high ZF", $ZF > f_{MR}$) or with low-pass character (for $ZF < f_{MR}$, $f_{MR}$ is for example the MRT excitation frequency) due to the preceding frequency conversion. This occurs either by corresponding filtering before the entrance into the shielding chamber and/or after the entrance of the signal into the shielding box. Moreover, the metal wall of the shielding chamber can itself be executed so that it—together with the conductor and possible additional discrete components—forms a corresponding high-pass or low-pass character that suppresses the transmission of interference signals at fMR out of the shielding box. The high degrees of attenuation that are necessary for sufficient suppression of the interference of the ADW are therefore realized. In order to prevent interference signals from exiting from the filter box at the ZF level and being converted into the MR frequency level via the mixer, a ZF amplifier with strong reverse suppression (s12<<0.1, small scatter parameter from output to input) can additionally be used (not shown in the image) between mixer and filter through-conductor.

3. Solution for Problem #5 in Particular

In the arrangement shown in FIG. 4, the two mix products $ZF_{1,2} = |f_{LO} \pm f_{MR}|$ are additionally processed as a sum signal. No spectral separation of the components ($ZF_1 < f_{MR}$ and $ZF_2 > f_{MR}$) occurs. The sum signal thus has the envelope of the LO signal. In the shown example the LO frequency corresponds to the sampling frequency of the subsequent ADW. With a suitable phase relationship between envelope (or LO signal) and sampling, it is achieved that the mixing always occurs at the maximum of the envelope (for example by insertion of a phase shifter into the LO path). At the apexes, the sum signal possesses a voltage amplitude that is greater by a factor of two than each of the two partial signals $ZF_1$ and $ZF_2$. An increase of the cascade voltage amplification by 6 dB is achieved via the LO-synchronous sampling of the sum signal. In FIG. 3 it is recognized that the mix products $ZF_1$ and $ZF_2$ at the frequency level respectively fall with the same orientation in alias bands of odd-numbered magnitude. After the sampling the components thus overlap one another with correct position in the baseband. An example of a 1.5 T MR application at 63.6 MHz is shown.

Advantages:
6 dB voltage gain
LNA can exhibit an amplification reduced by 6 dB (stability)
LNA must deliver 6 dB lower output voltage (power consumption)
The modulation capability of the mixer can be dimensioned 6 dB lower
The idea of the LO-synchronous sampling of the sum signal can be expanded by a multiplexer function based on signal orthogonality FIG. 2 shows simplified components of an arrangement of the proposed concept 1+2 according to the invention.

Reception signal E received by a local coil 6a of a local coil arrangement is amplified with an amplifier 23 (preamp amplifier at the local coil arrangement 6a) and converted with a frequency converter 24 into an intermediate frequency signals Z with intermediate frequency different than the reception signal frequency of the reception signals. The intermediate frequency signal Z is directed through a frequency filter $F_1$ into a shielding device S (a housing shielding against electromagnetic waves, made of metal for example) surrounding at least the analog-digital converter and is supplied via an analog signal processing device SV (for example mixing, filtering, amplification, compression) to an analog-digital converter ADW for conversion into digitized signals D.

An additional signal preparation (modulation, mixing, amplification etc.) of the signal digitized by the analog-digital converter ensues via a transmission device SE. If the frequency filter $F_1$ (and $F_2$) has a transmission range for signals with the intermediate frequency of the intermediate frequency signals Z and appropriately has a blocking range at least for other signals (such as signals with the reception signal frequency of the reception signal E), the intermediate frequency signal Z can arrive via the frequency filter at the analog-digital converter ADW. However, signals in the MR reception frequency range are damped, but upon entrance into the shield housing and upon exit from the shield housing. The analog-digital converter ADW can therefore digitize a signal that is very suitable for digitization.

The digitized signals (which here are additionally prepared by SE) are directed outside of the shielding S via an additional frequency filter $F_2$ and supplied to an antenna 66.

Signals radiated by the antenna 66 can be received via an antenna 67 and supplied to an MRT evaluation device 17, 19, 20, 21.

FIGS. 4A, 4B, 4C and 4D show simplified components of an arrangement according to the invention according to concept proposal 3, and respective signal curves. Explanations regarding the elements at the bottom in FIG. 4A, from left to right:

The circle schematically represents a local coil 6a; the entered frequency 63.6 MHz of the 1.5 T MR frequency of an example system.

LNA="Low Noise Amplifier" is a low-noise amplifier that, in previous local coils, is also arranged directly at the local coil (within the local coil housing). This is the case because attenuation (cable) connected between coil and LNA would enter directly into the noise factor of the system (worsening of the signal-to-noise ratio).

IR filter="Image Rejection Filter": the mixer converts the desired frequency band and the mirror frequency band into the intermediate frequency levels according to ZF1,2=|F_LO+−f_input| (ZF1=53.6 MHz and ZF2=73.6 MHz)). In the concrete case:
ZF1=63.6 MHz+10 MHz and ZF2=63.6 MHz−10 MHz are desired;

ZF1=43.6 MHz+10 MHz and ZF2=83.6 MHz−10 MHz are unwanted (mirror frequencies). The IR filter has the task of suppressing noise contributions from the mirror bands (43.6 MHz and 83.6 MHz). (Note: conventional receiver architectures would only process one of the two ZF bands).

Mixer is the frequency mixer that converts the input signal from the MR frequency level into the two intermediate frequency levels (52.6 MHz and 73.6 MHz). This occurs by mixing the MR signal with the local oscillator signal (10 MHz).

"Mixer trace filter": in addition to the desired ZF signals, the mixer also generates mixing products of a higher order ("spurious signals";

ZFtrace=m*63.6 MHz+−n*10 MHz; with m=1, 2, 3 . . . and n=1, 2, 3 . . . ). The filter has the task of suppressing these interference signals before they reach the following amplifier. It additionally suppresses interference components at the MR frequency that might "not be seen" by the local coil. It is essentially transmissive only for $ZF_1$ and $ZF_2$.

IF-LNA="Intermediate Frequency Low Noise Amplifier" is an intermediate frequency amplifier.

Alias filter: this filter suppresses signal spectra that do not lie in the desired Nyquist bands of the AD conversion (desired here: alias bands 11 and 15; see image 3). Since the ADW samples with 10 MS/s, signals that lie in the frequency range at n*10 MHz+−5 MHz all fall into the same baseband after the sampling (0 to 5 MHz; first Nyquist band). This in particular also applies for noise. The noise components from the individual Nyquist bands thus superimpose in the base band and must be suppressed as well as possible.

S&H="Sample and Hold" as part of the ADW (=ADC)

ADW="Analog-Digital Converter" or AD converter.

The ADW data stream is sent from the local coil housing to the out-of-line digital signal processing unit (DSP) (cable, optical wave guide (LWL) or radio link). The shielding comprises the part of the chain as of IF-LNA. The mixer trace filter would ideally be integrated into the shield wall, thus represents the interface between unshielded and shielded. The cable to transfer the ADW data is completely shielded. This is superfluous given LWL or radio transmission.

Figure 5A:
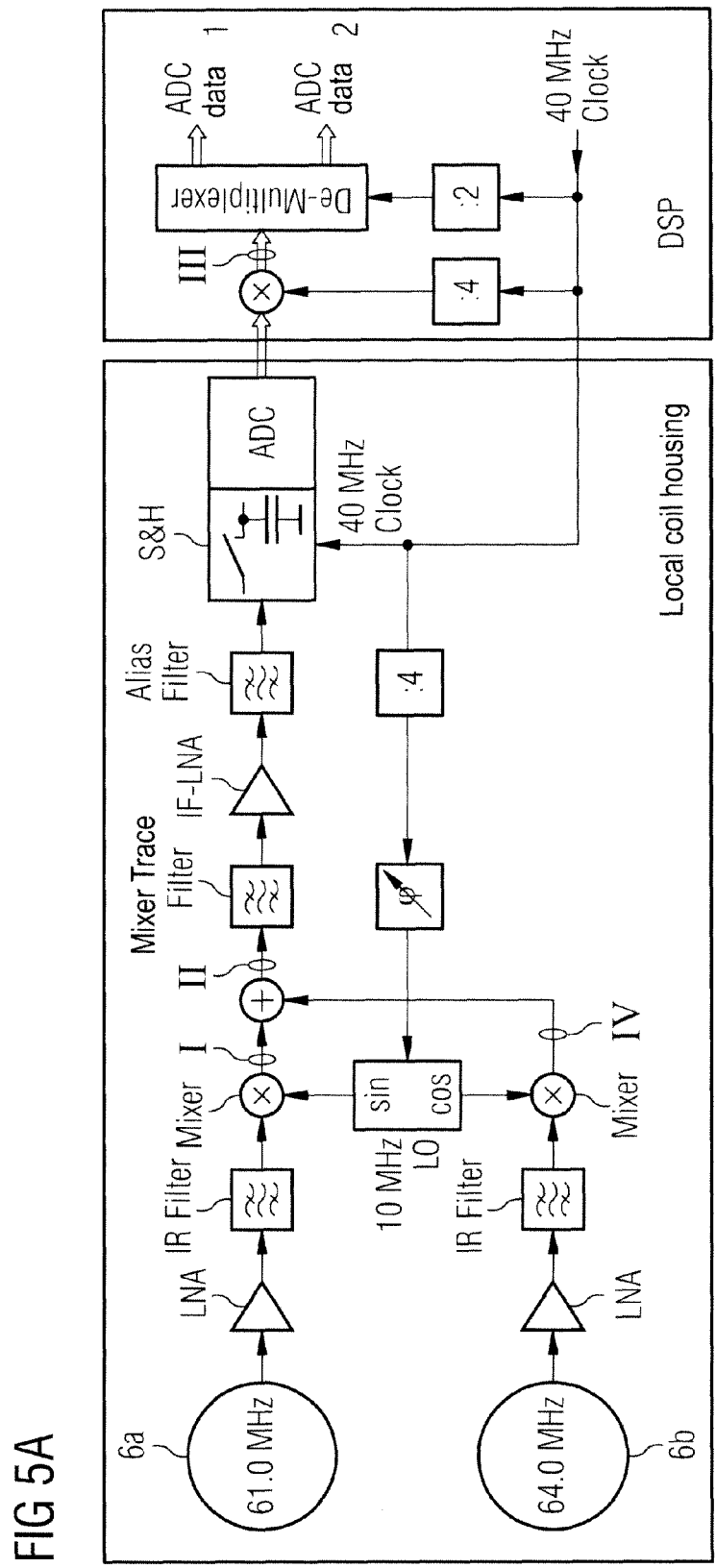
FIG. 5A is a schematic illustration of components of a local coil arrangement according to the invention, a (DSP) receiver unit for broadcast signals, and signal curves in the time period at different points, and FIGS. 5B, 5C, 5D and 5E respectively show signals that occur at the indicated locations in FIG. 5A.
Figure 5B:
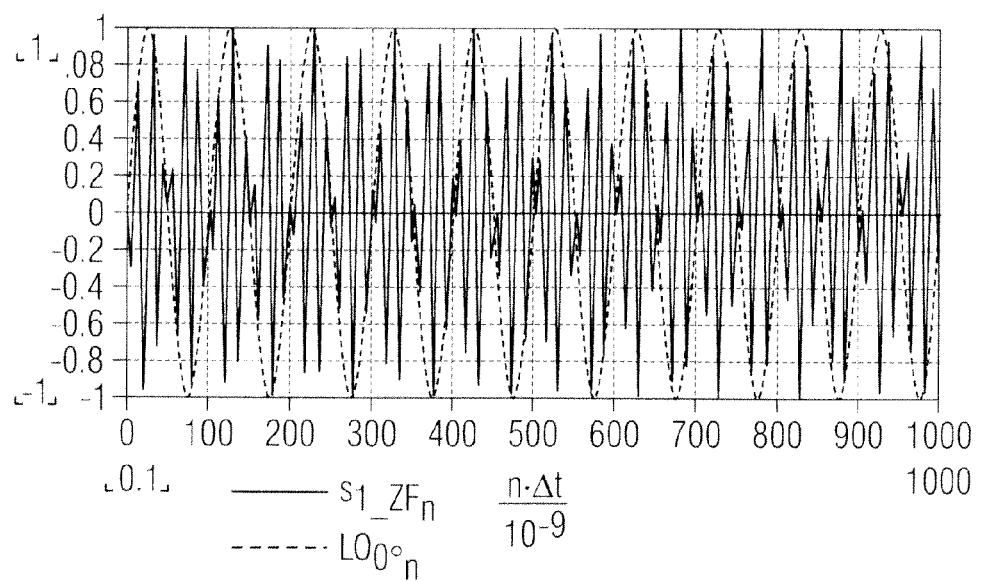
Figure 5C:
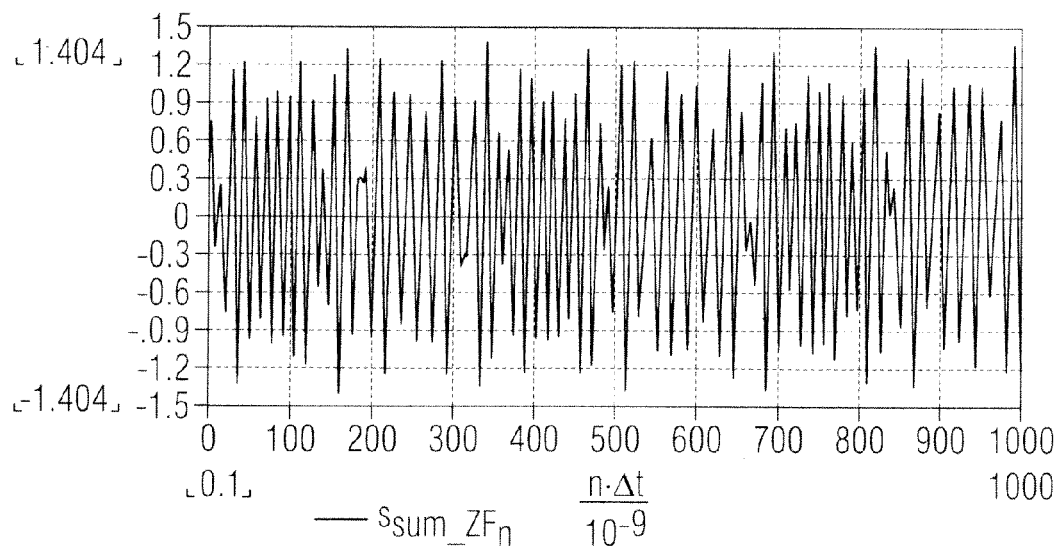
Figure 5D:
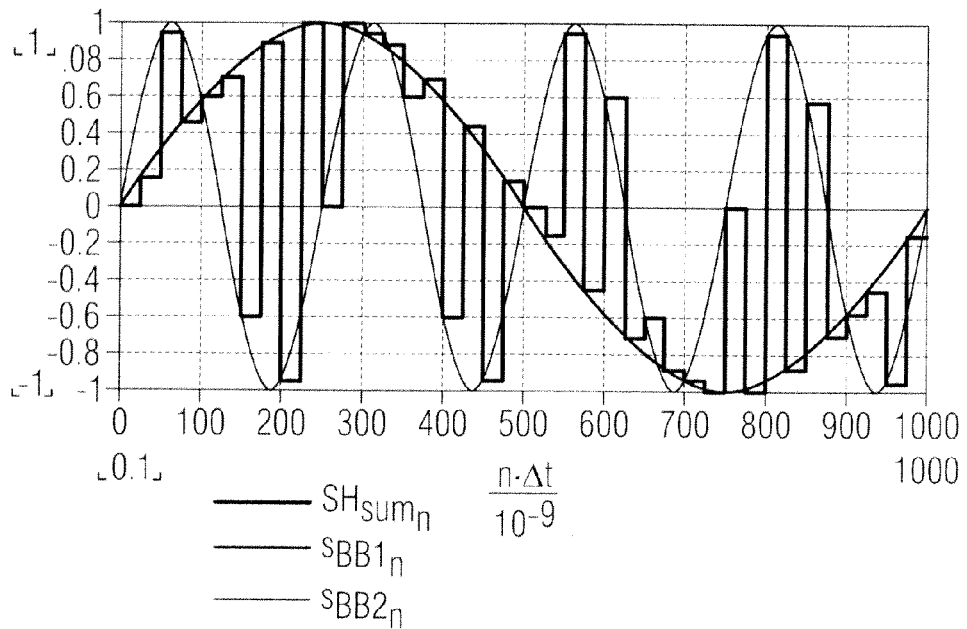
Figure 5E:
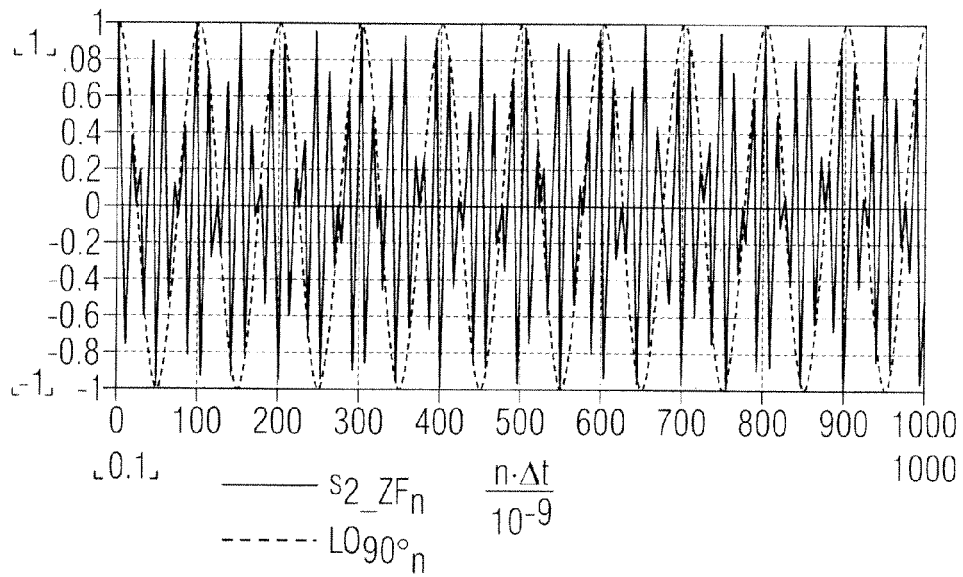

FIG. 5A shows an additional proposed arrangement (multiplexer function based on signal orthogonality). The shown input frequencies of two local coils (designated here with "61.0 MHz" and 64.0 MHz") was deliberately, unrealistically chosen with a large interval (61 MHz and 64 MHz) in order to achieve an illustrative depiction in the signal diagrams. FIGS. 5B, 5C, 5D and 5E respectively illustrate the signals that occur at locations I, II, III and IV in FIG. 5A.

This arrangement possesses two signal inputs (here MR local coil antennas 6*a*, 6*b*). After a preamplification with a preamplifier ("LNA") and a filtering—with a filter ("IR filter")—of received frequencies that are different than those to be examined, the signals are mixed (sine "sin" and cosine "cos") with an LO signal offset by 90°. The two sum signals are added after the mixer (frequency converter). The ADW sample frequency is selected to be greater by a factor of four than the LO frequency. It is hereby achieved that every peak (positive and negative, thus maxima and minima) of the signals $ZF_1$ and $ZF_2$ that are contained in the sum signal $ZF_{1,2}=|f_{LO}\pm f_{Sig}|$ is sampled. Due to the orthogonality of the envelopes, the peaks of the $ZF_1$ signal respectively fall at the zero crossings of the $ZF_2$ signal and vice versa. The sample values of signal 1 and signal 2 continuously alternate in the sampling.

Since it is respectively sampled at the positive peak and negative peak, the sampled signal is periodically inverted from sample to sample. This is reversed via a mixing of the ADW data stream with the LO frequency in the digital domains. The separation of the two partial signals ensues (after a radio transmission) in a digital demultiplexer in a "DSP" unit (or, respectively, for example in 68 in FIG. 1) via sorting of the individual sample values.

By the addition of the two mixer output signals, a voltage elevation of up to 3 dB occurs between the sampling points in time. However, at the individual sampling points in time the signal amplitude corresponds exactly to the current value of the respective individual signal. The dynamic range of the individual function blocks therefore does not need to be designed larger than is required for processing of the individual signals.

Advantage:

Two input signals are sampled via one ADW; the number of required ADW modules, ZF filters, ZF amplifiers and compressors is halved.

It is therefore clear that the frequency conversion within the coil can be suitable for digitization of the MR signals in the local coil.

One idea is the combination of a frequency conversion in the local coil with a filter-like housing through-conduction that strongly suppresses the transmission of the MR frequency. The combination of these circuit systems enables interference to be kept away from the sensitive local coil antennas. This is also shown in a very simplified manner in FIG. 2, for example.

Advantageous embodiments are in particular a processing of the mixer output signal as a sum signal of two intermediate frequency signals (ZF1 and ZF2), a use of an LO frequency with $f_{LO}=f_{sampling}$ and synchronous sampling in the peaks of the ZF signal envelope, an expansion of the described architecture to a double multiplexer system based on the synchronous sampling of a sum signal consisting of two signals with envelopes orthogonal to one another. For this the output signals of two mixer arrangements (respectively consisting of a sum signal of ZF1 and ZF2) are added. The orthogonality of the two signals relative to one another arises from the use of LO signals offset by 90°.

Although modifications and changes may be suggested by those skilled in the art, it is the intention of the inventor to embody within the patent warranted hereon all changes and modifications as reasonably and properly come within the scope of his contribution to the art.

We claim as our invention:

1. A magnetic resonance (MR) tomography local coil arrangement, comprising:

at least one local coil configured to receive at least one MR reception signal, each MR reception signal having a reception signal frequency in the radio-frequency (RF) range;

at least one amplifier that amplifies the at least one MR reception signal;

a frequency converter circuit that generates at least one analog intermediate frequency signal from the at least one MR reception signal, said intermediate frequency signal having an intermediate frequency that differs from the reception signal frequency of each MR reception signal;

an analog-to-digital converter that converts the analog intermediate frequency signal into a digitized intermediate frequency signal;

a shielding device that shields against signals in the RF range, said shielding device surrounding at least the analog-to-digital converter;

at least one frequency filter between the at least one local coil and the analog-to-digital converter, the frequency filter having a transmission range for signals with the intermediate frequency of the intermediate frequency signal; and a device that transmits the digitized intermediate frequency signal.

2. A local coil arrangement as claimed in claim 1 wherein the frequency filter is arranged at an input of the shielding device through which the analog intermediate signal is supplied to the analog-to-digital converter, and said local coil arrangement comprising an additional frequency filter arranged at an output of the shielding device, through which the digitized intermediate frequency signal is supplied to the device that transmits the digitized intermediate frequency signal.

3. A local coil arrangement as claimed in claim 1, comprising:

an analog signal processing device connected with the analog-to-digital converter, said analog signal processing device being configured to perform at least one function selected from the group consisting of mixing, filtering, amplification, and compression of said analog intermediate frequency signal, before digitization thereof by said analog-to-digital converter.

4. A local coil arrangement as claimed in claim 1 wherein said device that transmits the digitized intermediate frequency signal is connected with the analog-to-digital converter via a connection through a transmission device, said connection preceding out from said shielding device.

5. A local coil arrangement as claimed in claim 4 wherein said transmission device is configured to perform at least one function selected from the group consisting of modulation, encoding, mixing, and amplification of said digitized intermediate frequency signal before supplying said digitized intermediate frequency signal to said device that transmits the digitized intermediate frequency signal.

6. A local coil arrangement as claimed in claim 1 wherein the frequency filter comprises at least one filter selected from the group consisting of high-pass filters, low-pass filters, and bandpass filters.

7. A local coil arrangement as claimed in claim 1 wherein the frequency converter circuit contains an oscillator that generates a local oscillator signal having a local oscillator frequency.

8. A local coil arrangement as claimed in claim 1 wherein said frequency converter circuit comprises at least one frequency converter that generates said intermediate frequency signal containing intermediate frequency components respectively formed as a sum and a difference of the local oscillator signal and the MR reception signal, and that has an envelope with the frequency of the local oscillator signal.

9. A local coil arrangement as claimed in claim 1 wherein said frequency converter circuit comprises a first frequency converter supplied at an input thereof with a first input signal, and a second frequency converter supplied at an input thereof with a second input signal, said first and second frequency converters being independent of each other and respectively generating a first intermediate frequency signal and a second intermediate frequency signal, said frequency converter circuit comprising a node at which said first intermediate frequency signal and said second intermediate frequency signal are combined to form a sum signal.

10. A local coil arrangement as claimed in claim 9 wherein said sum signal is supplied to said frequency filter and thereafter to said analog-to-digital converter as said analog intermediate frequency signal.

11. A local coil arrangement as claimed in claim 10 wherein each of said first and second intermediate frequency signals has a signal envelope, and wherein said frequency converter circuit comprises at least one local oscillator circuit that generates two local oscillator signals that are offset by 90° relative to each other, said two local oscillator signals being respectively supplied to said first and second frequency converters and causing the respective envelopes of the first and second intermediate frequency signals to be orthogonal relative to each other.

12. A local coil arrangement as claimed in claim 11 wherein said analog-to-digital converter operates at a sampling frequency selecting from the group consisting of a sampling frequency that is equal to the frequency of the two local oscillator signals, a sampling frequency that is twice the frequency of the two local oscillator signals, and a sampling frequency that is four times the frequency of the two local oscillator signals, and a sampling frequency that is a multiple of the frequency of the two local oscillator signals.

13. A local coil arrangement as claimed in claim 9 comprising a phase shifter that adjusts a sampling point in time of said analog-to-digital converter that causes said sampling point in time to coincide with a peak of an envelope of said sum intermediate frequency signal.

14. A local coil arrangement as claimed in claim 1 wherein said at least one local coil is a component of a magnetic resonance tomography apparatus operating with an RF pulse signal, and wherein said at least one frequency filter blocks transmission of at least one of said at least one MR reception signal, and said RF pulse signal.

15. A local coil arrangement as claimed in claim 1 comprising a plurality of local coils respectively connected to a plurality of frequency converters via at least one preamplifier, said plurality of frequency converters being connected to said analog-to-digital converter.

16. A local coil arrangement as claimed in claim 1 wherein said device that transmits said digitized intermediate frequency signal is an antenna.

17. A method for operating a local coil arrangement of a magnetic resonance tomography apparatus, comprising the steps of:

with at least one local coil, receiving at least one MR reception signal, each MR reception signal having a reception signal frequency in the radio-frequency (RF) range;

amplifying the at least one MR reception signal;

with a frequency converter circuit, generating at least one analog intermediate frequency signal from the at least one MR reception signal, said intermediate frequency signal having an intermediate frequency that differs from the reception signal frequency of each MR reception signal;

in an analog-to-digital converter, converting the analog intermediate frequency signal into a digitized intermediate frequency signal;

shielding at least said analog-to-digital converter against signals in the RF range with a shielding device;

providing at least one frequency filter between the at least one local coil and the analog-to-digital converter, the frequency filter having a transmission range for signals with the intermediate frequency of the intermediate frequency signal; and transmitting the digitized intermediate frequency signal.

18. A method as claimed in claim 17 comprising connecting the frequency filter at an input of the shielding device through which the analog intermediate signal is supplied to the analog-to-digital converter, and providing an additional frequency filter at an output of the shielding device, through which the digitized intermediate frequency signal is supplied to the device that transmits the digitized intermediate frequency signal.

19. A method as claimed in claim 17, comprising:
connecting an analog signal processing device with the analog-to-digital converter, and in said analog signal processing device, performing at least one function selected from the group consisting of mixing, filtering, amplification, and compression of said analog intermediate frequency signal, before digitization thereof by said analog-to-digital converter.

20. A method as claimed in claim 17 comprising connecting a device that transmits the digitized intermediate frequency signal with the analog-to-digital converter via a connection preceding out from said shielding device.

21. A method as claimed in claim 20 comprising providing said connecting in a transmission device and, in said transmission device, performing at least one function selected from the group consisting of modulation, encoding, mixing, and amplification of said digitized intermediate frequency signal before supplying said digitized intermediate frequency signal to said device that transmits the digitized intermediate frequency signal.

22. A method as claimed in claim 17 comprising providing, as said frequency filter, at least one filter selected from the group consisting of high-pass filters, low-pass filters, and bandpass filters.

23. A method as claimed in claim 17 comprising, in said frequency converter circuit, providing an oscillator that generates a local oscillator signal having a local oscillator frequency.

24. A method as claimed in claim 17 comprising providing, in said frequency converter circuit, at least one frequency converter that generates said intermediate frequency signal containing intermediate frequency components respectively formed as a sum and a difference of the local oscillator signal and the MR reception signal, and that has an envelope with the frequency of the local oscillator signal.

25. A method as claimed in claim 17 comprising providing, in said frequency converter circuit, a first frequency converter supplied at an input thereof with a first input signal, and a second frequency converter supplied at an input thereof with a second input signal, said first and second frequency converters being independent of each other and respectively generating a first intermediate frequency signal and a second intermediate frequency signal and, in said frequency converter circuit, providing a node at which said first intermediate frequency signal and said second intermediate frequency signal are combined to form a sum signal.

26. A method as claimed in claim 25 comprising supplying said sum signal to said frequency filter and thereafter to said analog-to-digital converter as said analog intermediate frequency signal.

27. A method as claimed in claim 26 wherein each of said first and second intermediate frequency signals has a signal envelope comprising, in said frequency converter circuit, providing at least one local oscillator circuit that generates two local oscillator signals that are offset by 90° relative to each other, and supplying said two local oscillator signals being respectively supplied to said first and second frequency converters to cause the respective envelopes of the first and second intermediate frequency signals to be orthogonal relative to each other.

28. A method as claimed in claim 27 comprising operating said analog-to-digital converter at a sampling frequency selecting from the group consisting of a sampling frequency that is equal to the frequency of the two local oscillator signals, a sampling frequency that is twice the frequency of the two local oscillator signals, and a sampling frequency that is four times the frequency of the two local oscillator signals, and a sampling frequency that is a multiple of the frequency of the two local oscillator signals.

29. A method as claimed in claim 25 comprising, with a phase shifter, adjusting a sampling point in time of said analog-to-digital converter to cause said sampling point in time to coincide with a peak of an envelope of said sum intermediate frequency signal.

30. A method as claimed in claim 17 wherein said at least one local coil is a component of a magnetic resonance tomography apparatus operating with an RF pulse signal comprising, in said at least one frequency filter, blocking transmission of at least one of said at least one MR reception signal, and said RF pulse signal.

31. A method as claimed in claim 17 comprising providing a plurality of local coils respectively connected to a plurality of frequency converters via at least one preamplifier, and connecting said plurality of frequency converters being connected to said analog-to-digital converter.

32. A method as claimed in claim 17 comprising transmitting said digitized intermediate frequency signal via an antenna.

* * * * *